(12) United States Patent
Nakazato

(10) Patent No.: US 9,318,189 B2
(45) Date of Patent: Apr. 19, 2016

(54) SENSE AMPLIFIER CIRCUIT

(71) Applicant: KABUSHIKI KAISHA TOSHIBA, Tokyo (JP)

(72) Inventor: Takaaki Nakazato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 14/015,977

(22) Filed: Aug. 30, 2013

(65) Prior Publication Data

US 2014/0140144 A1 May 22, 2014

(30) Foreign Application Priority Data

Nov. 21, 2012 (JP) ................................. 2012-255532

(51) Int. Cl.
*G11C 7/06* (2006.01)
*G11C 7/10* (2006.01)
*G11C 11/419* (2006.01)
*G11C 11/413* (2006.01)

(52) U.S. Cl.
CPC ............... *G11C 11/419* (2013.01); *G11C 7/06* (2013.01); *G11C 7/1012* (2013.01); *G11C 7/1048* (2013.01); *G11C 11/413* (2013.01)

(58) Field of Classification Search
CPC .. G11C 11/413; G11C 11/419; G11C 7/1012; G11C 7/1048; G11C 7/06–7/08
See application file for complete search history.

(56) References Cited

U.S. PATENT DOCUMENTS

| 6,046,931 | A | * | 4/2000 | Horne et al. | ................... 365/168 |
| 2002/0075731 | A1 | * | 6/2002 | Amano | ......................... 365/196 |
| 2007/0109024 | A1 | | 5/2007 | Hung | |
| 2010/0238749 | A1 | | 9/2010 | Kushida | |
| 2011/0235449 | A1 | | 9/2011 | Chen et al. | |
| 2012/0195135 | A1 | * | 8/2012 | Kawasumi | ............... 365/189.06 |

FOREIGN PATENT DOCUMENTS

JP  H09147575 A  6/1997
JP  2011-204339  10/2011

OTHER PUBLICATIONS

Japanese Office Action dated Dec. 15, 2015 in counterpart Japanese Patent Application 2012-255532 with English Translation.

* cited by examiner

*Primary Examiner* — Khamdan Alrobaie
(74) *Attorney, Agent, or Firm* — Patterson & Sheridan, LLP

(57) ABSTRACT

A sense amplifier circuit includes first and second lines and first and second inverters. Each inverter includes an input terminal, an output terminal, and a power source terminal. A second signal line potential is supplied to the first inverter input terminal. The second inverter input terminal is connected to the first inverter input terminal. A first signal line potential is supplied to the second inverter input terminal. A first switch transistor is connected to the first inverter power source terminal and has a gate connected to the second signal line. A switch second transistor is connected to the second inverter power source terminal and has a gate connected to the first signal line.

18 Claims, 6 Drawing Sheets

SENSE AMPLIFIER CIRCUIT

CROSS-REFERENCE TO RELATED APPLICATION

This application is based upon and claims the benefit of priority from Japanese Patent Application No. 2012-255532, filed Nov. 21, 2012, the entire contents of which are incorporated herein by reference.

FIELD

Embodiments of the present application are related to a sense amplifier circuit.

BACKGROUND

In recent years, a sense amplifier circuit having a cross-coupled inverter has been used as a circuit for reading minute signals such as data stored in a memory cell. In such a sense amplifier circuit, when there is a mismatch of threshold voltages of a pair of n-channel MOS transistors in the cross-coupled inverter, a reading error is more likely to occur. In other words, due to mismatched threshold voltages of the n-channel MOS transistors, the sense amplifier circuit may misread a "High" voltage as a "Low" voltage, and due to this misreading, the sense amplifier circuit latches inverted data.

SUMMARY

Embodiments provide a sense amplifier circuit that suppresses occurrence of read errors.

A sense amplifier circuit according to a first embodiment includes first and second signal lines, first and second inverters, and first and second switch transistors. The first inverter includes a first input terminal, a first output terminal, and a first power source terminal A potential of the second signal line is supplied to the first input terminal The second inverter includes a second input terminal, a second output terminal, and a second power source terminal The second input terminal is connected to the first output terminal, the second output terminal is connected to the first input terminal, and a potential of the first signal line is supplied to the second input terminal. The first switch transistor has a first gate electrode to which the potential of the second signal line is supplied. The first power source terminal is connected to one end of a current path of the first switch transistor. The second switch transistor includes a second gate electrode and, an end of the current path of the second switch transistor is connected to the second power source terminal

DETAILED DESCRIPTION

Example embodiments of sense amplifier circuits are explained with reference to the drawings. Herein, specific examples in which sense amplifier circuits are applied to a semiconductor memory device such as a static random access memory (SRAM) are described. Elements having the same function and configuration are given the same reference number in different figures, and explanation for repeated elements will be given only when necessary.

[First Embodiment]

Figure 1:
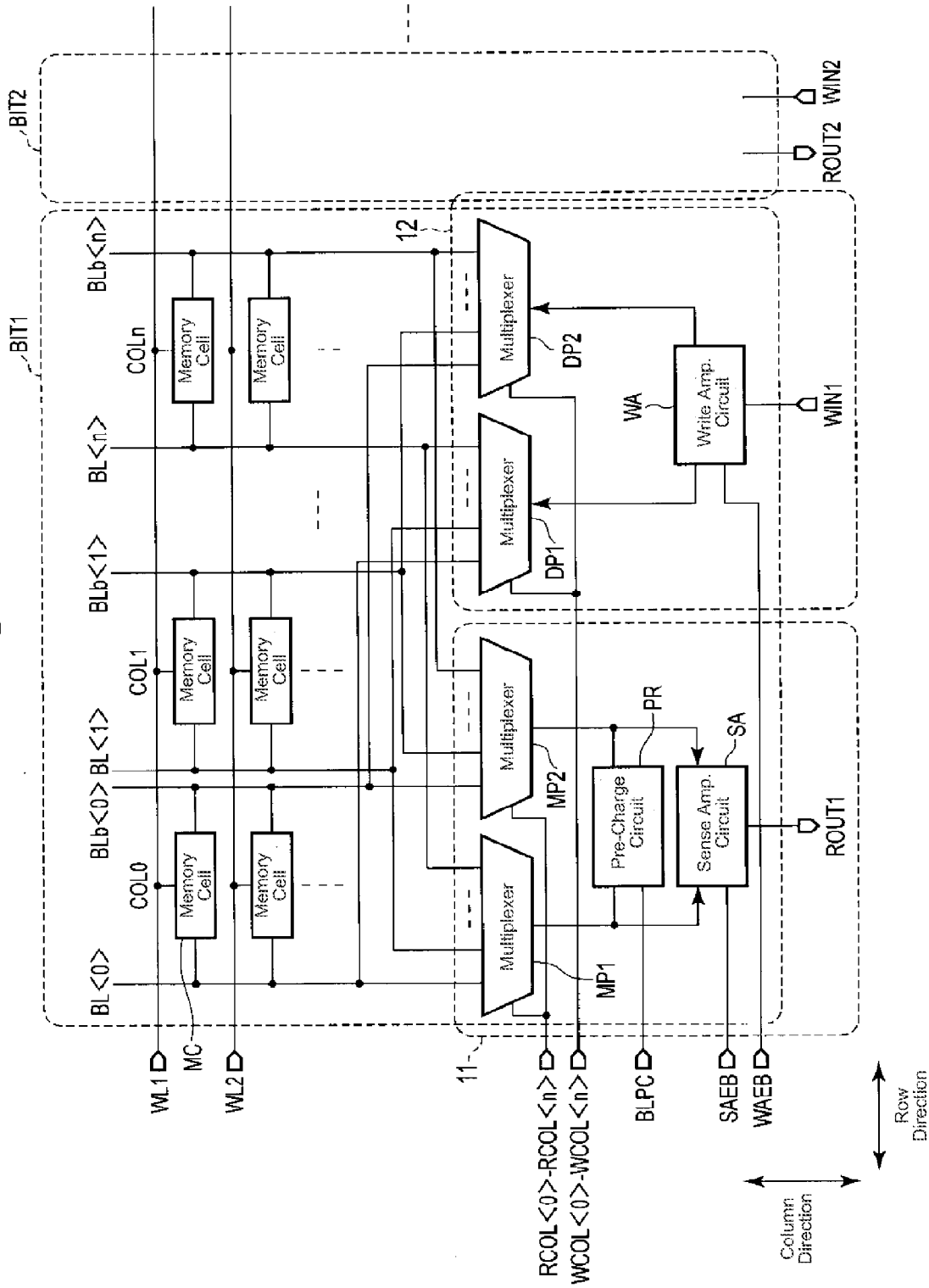
FIG. 1 is a block diagram of a static random access memory (SRAM) including a sense amplifier circuit according to a first embodiment.

FIG. 1 is a block diagram depicting a configuration of an SRAM including a sense amplifier circuit according to the first embodiment.

As illustrated, the SRAM is provided with blocks BIT1, BIT2, . . . . The block BIT1 has a plurality of memory cells MC, a read circuit 11 that reads data from the memory cells MC, and a write circuit 12 that writes data to the memory cells MC.

A plurality of memory cells MC is arranged in columns COL0, COL1, . . . , and COLn. A first end of the columns of memory cells MC (COL0, COL1, . . . COLn) of the plurality of memory cells MC is connected to respective bit lines BL<0>, BL<1>, . . . , BL<n> and a second end of the columns of memory cells MC is connected to respective complementary bit lines BLb<0>, BLb<1>, . . . , BLb<n>. The complementary bit lines forms a pair with the bit lines such that a bit line and a corresponding complementary bit line have opposite signals (e.g., if a bit line is at a high level potential, the corresponding complementary bit line is at a low level potential). Groups of the memory cells arrayed in a row direction are respectively connected to word lines WL1, WL2, etc. The bit lines BL<0>, BL<1>, . . . , BL<n> are connected to a multiplexer MP1. The complementary bit lines BLb<0>, BLb<1>, . . . , BLb<n> are connected to a multiplexer MP2.

Output terminals of the multiplexers MP1 and MP2 are each connected to a pre-charge circuit PR and a sense amplifier circuit SA. Multiplexer selection signals RCOL<0>, RCOL<1>, . . . , RCOL<n> are input to both the multiplexers MP1 and MP2. Pre-charge activation signal BLPC is input to the pre-charge circuit PR. Sense amplifier activation (enable) signals SAEB are input to the sense amplifier circuit SA. Furthermore, read data ROUT1 is output from the sense amplifier circuit. The bit lines BL<0>, BL<1>, . . . , BL<n> are connected to a demultiplexer DP1. The complementary bit lines BLb<0>, BLb<1>, . . . , BLb<n> are connected to a demultiplexer DP2.

Write data signal WIN1 and write amplifier activation (enable) signals WAEB are input to a write amplifier circuit. An output terminal of the write amplifier circuit WA is connected to each of the demultiplexers DP1 and DP2. Demultiplexer selection signals WCOL<0>, WCOL<1>, . . . , WCOL<n> are input to both the demultiplexers DP1 and DP2.

Note, the block BIT2 has similar configuration as the block BLT1, but read data ROUT2 is output from the block BIT2, and write data WIN2 is input to the block BIT2.

Next, a configuration of the read circuit 11 according to the first embodiment is explained.

Figure 2:
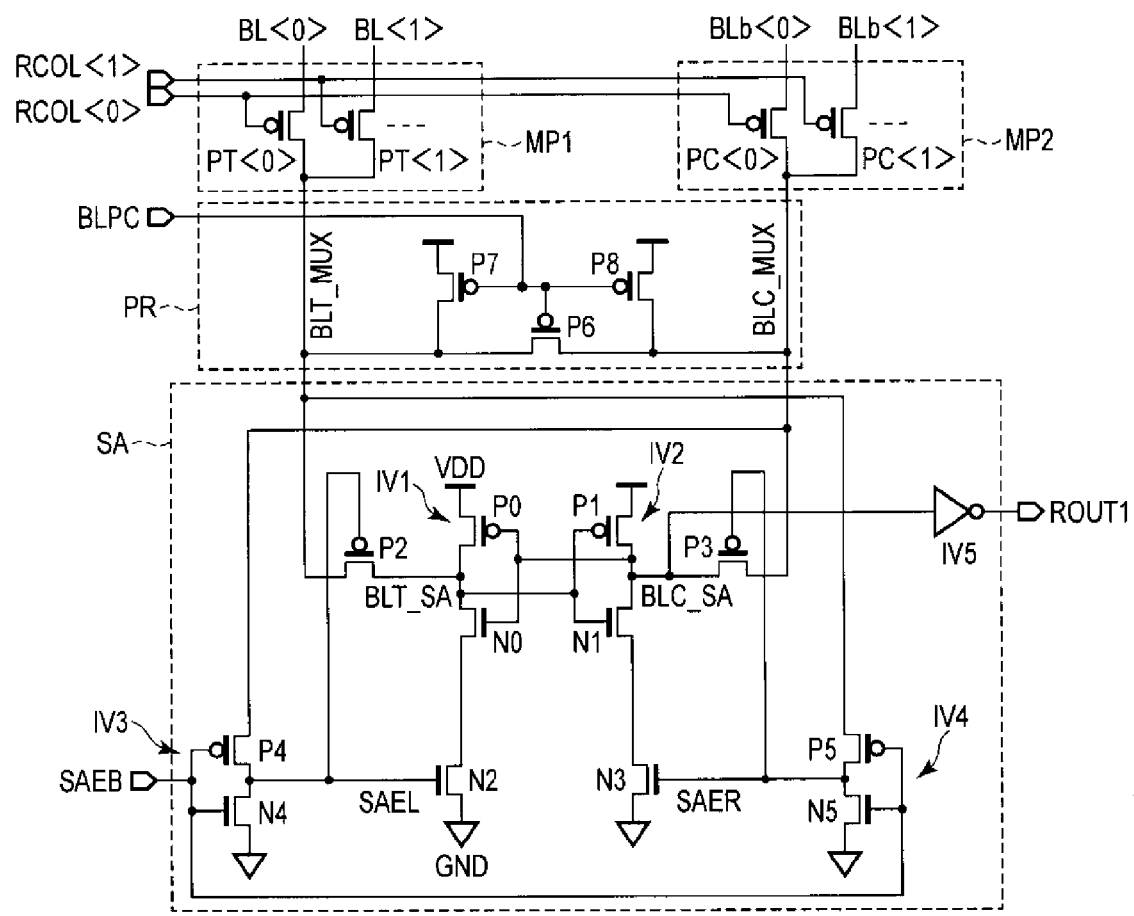
FIG. 2 is a circuit diagram of a read circuit including a sense amplifier circuit according to the first embodiment.

FIG. 2 is a circuit diagram depicting a configuration of the read circuit 11 including the sense amplifier circuit of FIG. 1.

As illustrated, the read circuit 11 is configured with the multiplexers MP1 and MP2, the pre-charge circuit PR, and the sense amplifier circuit SA.

The multiplexer MP1 includes p-channel MOS transistors (hereinafter, pMOS transistor) PT<0>, PT<1>, ..., PT<n>. The multiplexer MP1 selects a potential of the bit lines BL<0>, BL<1>, ..., BL<n> according to the multiplexer selection signals RCOL<0>, RCOL<1>, ..., RCOL<n>, and transmits these potentials to the sense amplifier circuit SA as bit line signals BLT_MUX.

In the same manner, the multiplexer MP2 includes the pMOS transistors PC<0>, PC<1>, ..., PC<n>. The multiplexer MP2 selects a potential of the complementary bit lines BLb<0>, BLb<1>, ..., BLb<n> according to the multiplexer selection signals RCOL<0>, RCOL<1>, ..., RCOL<n>, and transmits these potentials to the sense amplifier circuit SA as bit line signals BLC_MUX.

The sense amplifier circuit SA is configured with a first inverter IV1 consisting of a re-channel MOS transistor (hereinafter, nMOS transistor) N0 and a pMOS transistor P0, a second inverter IV2 formed with a nMOS transistor N1 and a pMOS transistor P1, first and second switch transistors (for example, nMOS transistors N2 and N3), first and second control circuits (for example, inverters IV3 and IV4), first and second transfer transistors (for example, pMOS transistors P2 and P3), and an inverter IV5.

The first inverter IV1 and the second inverter IV2 are cross-coupled. In other words, an output terminal of the first inverter IV1 is connected to an input terminal of the second inverter IV2, and an input terminal of the first inverter IV1 is connected to an output terminal of the second inverter IV2.

A drain of the first switch transistor (nMOS transistor) N2 is connected to a source of the nMOS transistor N0. A drain of the second switch transistor (nMOS transistor) N3 is connected to a source of the nMOS transistor N1. In other words, the drain of the first switch transistor N2 is connected to a power source terminal of the first inverter IV1. The drain of the second switch transistor N3 is connected to a power source terminal of the second inverter IV2. Sources of the first and second switch transistors N2 and N3 are connected to standard voltage such as a ground potential source GND. Furthermore, sources of the pMOS transistors P0 and P1 are connected to a power source voltage source VDD, for example.

The inverter IV3 is used as a control circuit and includes the nMOS transistor N4 and the pMOS transistor P4. The sense amplifier activation signals (control signal) SAEB is input into an input terminal of inverter IV3. An output terminal of the inverter IV3 is connected to a gate of the first switch transistor N2. The bit line signals BLC_MUX are supplied to a source of the pMOS transistor P4, and a source of the nMOS transistor N4 is connected to the ground potential source GND.

Sense amplifier signals SAEL are supplied to the gate of the first switch transistor N2 from the output terminal of the inverter IV3. A potential of the sense amplifier signals SAEL becomes the potential of the bit line signals BLC_MUX when the sense amplifier activation signals SAEB are "Low" (hereafter, referred to as "L"), and becomes a ground potential when the sense amplifier activation signals SAEB are "H" (that is, a "High" level).

The inverter IV4 is used as a control circuit and includes a nMOS transistor N5 and a pMOS transistor P5. The sense amplifier activation signals SAEB are input to an input terminal of the inverter IV4. An output terminal of the inverter IV4 is connected to a gate of the second switch transistor N3. The bit line signals BLT_MUX are supplied to a source of the pMOS transistor P5, and a source of the nMOS transistor N5 is connected to the ground potential source GND.

Sense amplifier signals SAER are supplied to the gate of the second switch transistor N3 from an output terminal of the inverter IV4. A potential of the sense amplifier signals SAER becomes the potential of the bit line signals BLT_MUX when the sense amplifier activation signals SAEB are "L", and becomes a ground potential when the sense amplifier activation signals SAEB are "H".

Moreover, the potential of the bit line signals BLT_MUX is input to the output terminal of the first inverter IV1 and the input terminal of the second inverter IV2 via the pMOS transistor P2 as sense signals BLT_SA. The sense amplifier signals SAEL are input to a gate of the pMOS transistor P2.

The potential of the bit line signals BLC_MUX is input to the output terminal of the second inverter IV2 and the input terminal of the first inverter IV1 via pMOS transistor P3 as sense signals BLC_SA. The sense amplifier signals SAER are input to a gate of the pMOS transistor P3. Then, the sense signals BLC_SA are output via the inverter IV5 as read data ROUT1 from the sense amplifier circuit SA.

The pre-charge circuit PR is connected to a node between the multiplexer MP1 and the pMOS transistor P2 and a node between the multiplexer MP2 and the pMOS transistor P3. That is, a pMOS transistor P6 is connected between bit line signal line BLT_MUX (referred to below as bit line signals BLT_MUX) and bit line signal line BLC_MUX (referred to below as bit line signals BLC_MUX). A drain of a pMOS transistor P7 is connected between the bit line signals BLT_MUX and the pMOS transistor P6, and a drain of a pMOS transistor P8 is connected between the bit line signals BLC MUX and the pMOS transistor P6. Power supply voltage is supplied to the sources of the pMOS transistors P7 and P8. The pre-charge activation signals BLPC are input to gates of the pMOS transistors P6, P7, and P8, and the bit line signals BLT_MUX and BLC_MUX are pre-charged according to the pre-charge activation signal BLPC.

Figure 3:
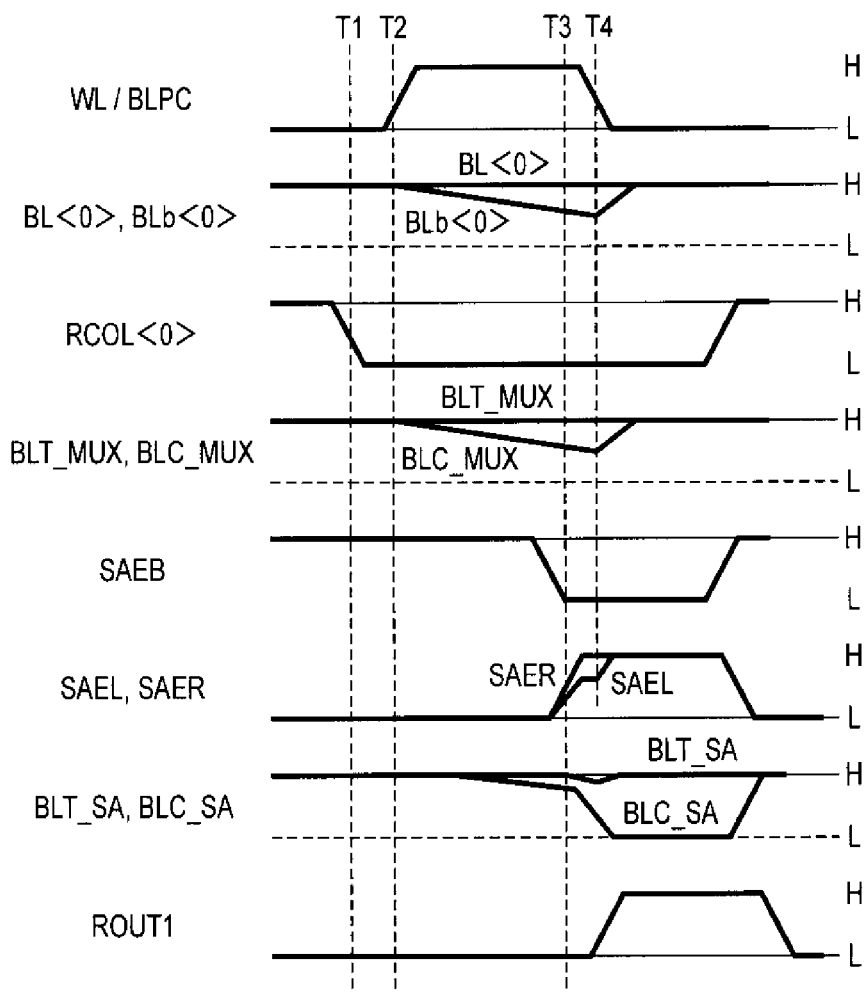
FIG. 3 is a timing chart depicting operation of the read circuit including a sense amplifier circuit according to the first embodiment.

FIG. 3 is a timing chart showing performance of the read circuit 11 including the sense amplifier circuit according to the first embodiment. Herein, it is assumed that data that has been stored in the memory cell MC connected to the bit line BL <0> and the complementary bit line BLb <0> and that data "1" (that is, "H") is stored in the memory cell MC.

As illustrated in FIG. 3, at the time T1, the multiplexer selection signals RCOL <0> become "L", and the pMOS transistors PT <0> and PC<0> are turned on. Thereby, the potential of the bit line BL <0> and the potential of the bit line signals BLT_MUX become the same, and the potential of the complementary bit line BLb <0> and the potential of the bit line signals BLC_MUX become the same.

Next, at the time T2, the pre-charge activation signals BLPC become "H", and the pMOS transistors P6, P7, and P8 are turned off, which thereby stops the pre-charging of the bit line signals BLT_MUX and BLC MUX to "H.".

The word line WL is also activated and the potential of the bit line BL <0> or the complementary bit line BLb <0> varies according to the data stored ("memorized") in the memory cell MC, for example data may be "1" indicating a "H" state. That is, the potential of the bit line BL <0>maintains a "H" state, and the potential of the complementary bit line BLb <0> falls from the "H" state. Thus, the potential of the bit line signals BLT_MUX maintains the "H" state, and the potential of the bit line signals BLC_MUX falls from the "H" state.

Next, at the time T3, the sense amplifier activation signals SAEB change from "H" to "L", and the sense amplifier signals SAEL and SAER transit from "L" to "H". At this time, the potential supplied to the source of the pMOS transistor P5 of the inverter IV4 is the bit line signals BLT_MUX, and the potential supplied to the source of the pMOS transistor P4 of the inverter IV3 is the bit line signal BLC_MUX. Because the potential of the bit line signals BLC_MUX is lower than the potential of the bit line signals BLT_MUX, the rising of the sense amplifier signals SAEL is gentle (slower) as compared with the sense amplifier signal SAER.

These sense amplifier signals SAEL and SAER are respectively input to the gates of the first and second switch transistors N2 and N3. Thereby, the sense signals BLT_SA at the first output terminal of the first inverter IV1 and the sense signals BLC_SA at the output terminal of the second inverter IV2, as shown in FIG. 3, become "H" and e "L," respectively. Thus, the appropriate data is latched to the first and second inverters IV1 and IV2, and the sense signal BLC_SA is output as the read data ROUT1 through the inverter IV5.

In addition, at the time T4, the word line WL is deactivated and the pre-charge activation signals BLPC become "L,"which thereby, begins the pre-charging of the bit-line signals BLT_MUX and BLCMUX to "H.".

As an example, a case where there is a mismatch of threshold voltages of the two nMOS transistors N0 and N1 is considered. Namely, the threshold voltage of the nMOS transistor N0 is lower than the threshold voltage of the nMOS transistor N1, and furthermore it is assumed that the same nMOS transistor is connected to the sources of the nMOS transistors N0 and N1 as substitutes for the first and second switch transistors N2 and N3. In this case, a current is more likely to flow in the nMOS transistor N0 than in the nMOS transistor N1. For this reason, the potential of the sense signal BLT_SA becomes lower than the potential of the sense signal BLC_SA, and inverted data may be latched to the first and second inverters (IV1 and IV2).

In contrast, in the present embodiment, the first and second switch transistors N2 and N3 are respectively connected to the sources of the nMOS transistors N0 and N1, and the bit-line signals BLC_MUX whose potential is lower than the bit-line signals BLT_MUX are supplied to the gate of the first switch transistor N2. For this reason, a current is less likely to flow in the nMOS transistor N0 and the first switch transistor N2. From this, the fall in the potential of the sense signals BLT_SA is suppressed, and the potential of the sense signals BLT_SA can be prevented from becoming lower than the potential of the sense signals BLC_SA. As a result, as shown in FIG. 3, the sense signals BLT_SA and the sense signals BLC_SA have the appropriate potential, and the correct data is latched to the first and second inverters IV1 and IV2.

In the first embodiment, when the sense amplifier circuit is activated, drive voltages (gate voltages) of the first and second switch transistors N2 and N3 are set according to bit-line potentials. From this, even when error reading is more likely to occur with the threshold voltages of the nMOS transistors N0 and N1, error reading is less likely to occur because a current is reduced such that states of the first and second switch transistors N2 and N3 may reflect appropriate read data.

Moreover, because the first and second switch transistors N2 and N3 reflect the potential remaining on the bit line even after the activation of the sense amplifier, even when error reading occurs, inverted (incorrect) data is not fed back to the first and second switch transistors N2 and N3, and the mismatch tolerance of the threshold voltages of the nMOS transistors N0 and N1 improves. The mismatch tolerance means that error reading is less likely occur even when there is an improper combination of the threshold voltages of the nMOS transistors N0 and N1, that is, for example, in the above-described embodiment when the nMOS transistor N0 has a threshold voltage lower than the nMOS transistor N1.

In addition, although in the example case explained above, the case where data "1" is memorized in the memory cell was explained, but even when data "0 ("L")" is memorized in the memory cell, the occurrence of error reading can be suppressed in by similar mechanism. Thus, when "0" is memorized in the memory cell, the bit-line signals BLT_MUX have a potential lower than the bit-line signals BLC_MUX. The bit-line signals BLT_MUX with the lower potential is supplied to the gate of the nMOS transistor N3, and a current is less likely to flow in the nMOS transistors N1 and N3. By this, the potential of the sense signals BLC_SA can be prevented from becoming lower than the potential of the sense signal BLT_SA, and the occurrence of error reading can be suppressed.

Also, although the first and second switch transistors N2 and N3 are connected to the sources of the nMOS transistors N0 and N1 of the first and second inverters IV1 and IV2 in the example shown in FIG. 2, embodiments are not limited to this arrangement. The switch circuit may have a configuration where the pMOS transistors are respectively connected to the sources of the pMOS transistors P0 and P1 of the first and second inverters IV1 and IV2 as substitutes for the first and second switch transistors N2 and N3. Furthermore, although as depicted in FIG. 2, the sense amplifier signals SAEL and SAER are respectively input to the gates of the second transfer transistors P2 and P3 and are controlled, embodiments are not limited to this arrangement. The transfer transistors P2 and P3 can be controlled according to the sense amplifier activation signals SAEB in this first embodiment or other embodiments.

As explained above, the mismatch tolerance of the threshold voltages of the nMOS transistors N0 and N1 that configure the sense amplifier circuit can be improved. That is, even when the threshold voltages of the nMOS transistors N0 and N1 that configure the sense amplifier circuit are a combination that is more likely to cause error reading, the occurrence of error reading can be suppressed.

Also, because the potential difference between a complementary bit line and a bit line required to read correctly can be small, the electric discharge time of the bit line can be shortened and power consumption can be reduced. Furthermore, because the potential difference of the complementary bit line and the bit line required to read correctly can be small, time required to read data from the memory cell, which is for example the time from the activation of the word line to the output of read data, can be shortened, and high-speed operation of the sense amplifier circuit is enabled.

[Second Embodiment]

In a second embodiment, an equalizer is provided between a node between the first inverter IV1 and the first switch transistor (nMOS transistor) N2 and a node between the second inverter IV2 and the second switch transistor (nMOS transistor) N3.

Figure 4:
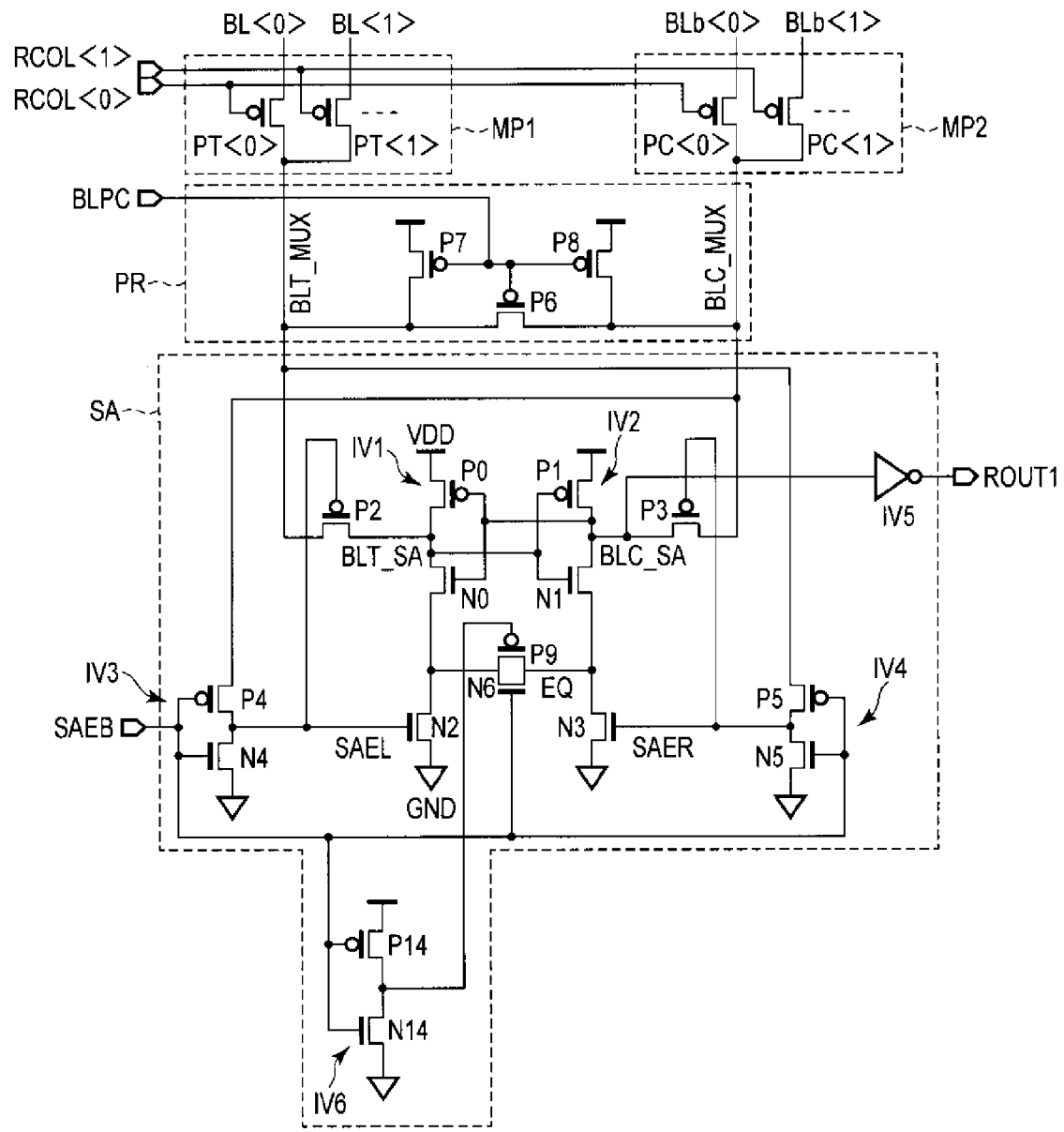
FIG. 4 is a circuit diagram of a read circuit including a sense amplifier circuit according to a second embodiment.

FIG. 4 is a circuit diagram depicting a configuration of a read circuit including a sense amplifier circuit according to a second embodiment.

As illustrated, in the sense amplifier circuit SA, an equalizer EQ is connected to a node between the source of the nMOS transistor N0 and the drain of the first switch transistor N2 and a node between the source of the nMOS transistor N1 and the drain of the second switch transistor N3.

The equalizer EQ includes a nMOS transistor N6 and a pMOS transistor P9. One end of a current path of the transistors N6 and P9 is connected to the source of the nMOS transistor N0, and the other end of the current path is connected to the source of the nMOS transistor N1. The sense amplifier activation signals SAEB are input to a gate of the nMOS transistor N6. Moreover, an inverter IV6 includes a nMOS transistor N14 and a pMOS transistor P14. The sense amplifier activation signals SAEB are input to an input terminal of the inverter IV6. An output terminal of the inverter IV6 is connected to a gate of the pMOS transistor P9. Thereby, the reverse signals of the sense amplifier activation signals SAEB are input into the gate of the pMOS transistor P9. Other configurations and performances are the same as that of the first embodiment.

In the second embodiment, because the potentials of the sources of the nMOS transistors N0 and N1 can be made the same when the sense amplifier circuit SA is deactivated, the potentials of the sources of the nMOS transistors N0 and N1 can be prevented from being an inconstant state immediately after the activation of the sense amplifier circuit SA. Other effects are the same as the first embodiment.

[Third Embodiment]

In a third embodiment, a pre-charge circuit is connected to a node between the first inverter IV 1 and the first switch transistor (nMOS transistor) N2 and a node between the second inverter IV2 and the second switch transistor (nMOS transistor) N3.

Figure 5:
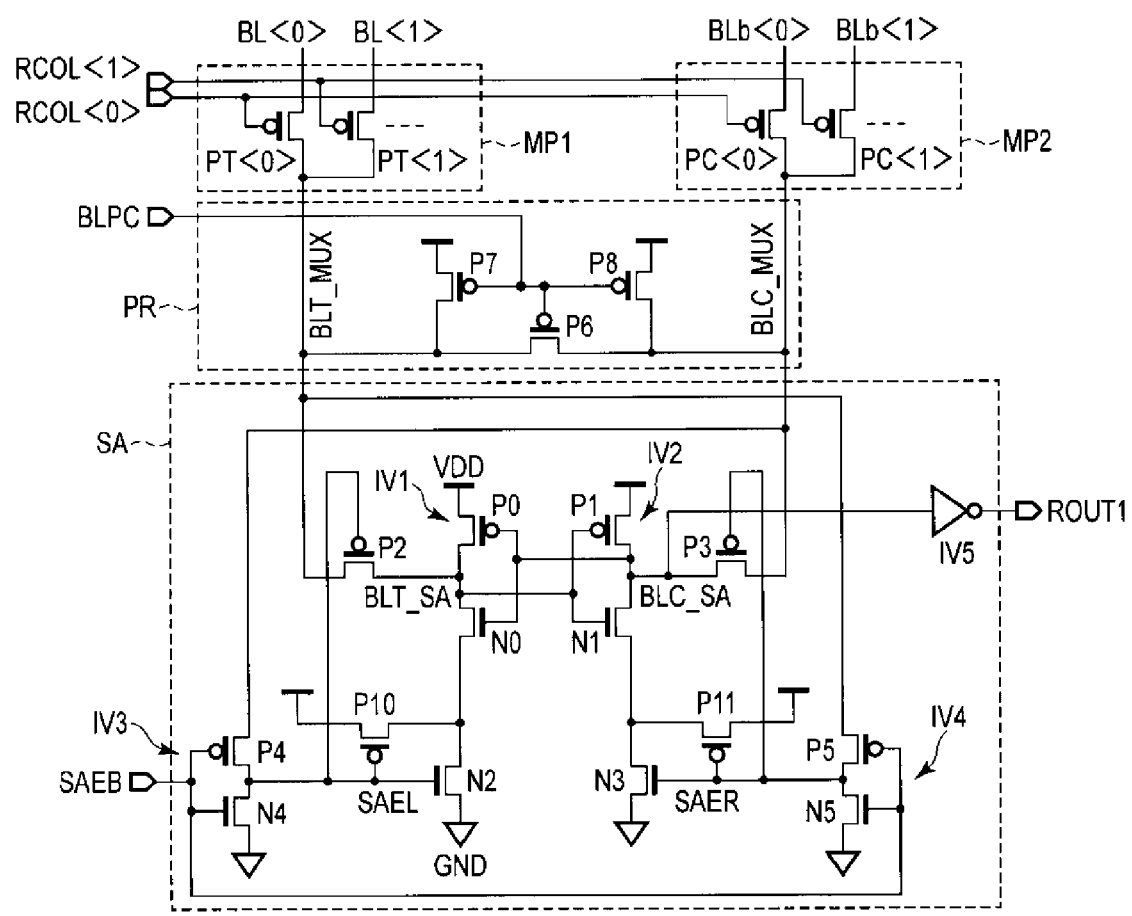
FIG. 5 is a circuit diagram of a read circuit including a sense amplifier circuit according to a third embodiment.

FIG. 5 is a circuit diagram depicting a configuration of a read circuit including a sense amplifier circuit according to a third embodiment.

As illustrated, in the sense amplifier circuit SA, a pre-charge circuit, which is for example a pMOS transistor P10, is connected to the node between the source of the nMOS transistor N0 and the drain of the first switch transistor N2. A pre-charge circuit, which is for example a pMOS transistor P11, is connected to the node between the source of the nMOS transistor N1 and the drain of the second switch transistor N3. That is, a drain of the pMOS transistor P10 is connected to the source of the nMOS transistor N0, and the power source voltage source VDD is connected to a source of the pMOS transistor P10. A drain of the pMOS transistor P11 is connected to the source of the nMOS transistor N1, and the power source voltage source VDD is connected to a source of the pMOS transistor P11. Furthermore, the sense amplifier signals SAEL are input to a gate of the pMOS transistor P10, and the sense amplifier signals SAER are input to a gate of the pMOS transistor P11. Other configurations and performances are the same as that of the first embodiment.

In the third embodiment, because the sources of the nMOS transistors N0 and N1 can be pre-charged to "H" when the sense amplifier circuit SA is deactivated, the potentials of the sources of the nMOS transistors N0 and N1 can be prevented from being an inconstant state immediately after the activation of the sense amplifier circuit SA. Other effects are the same as the first embodiment.

[Fourth Embodiment]

In a fourth embodiment, a circuit is provided that supplies a bit line potential to the node between the first inverter IV1 and the first switch transistor (nMOS transistor) N2 and the node between the second inverter IV2 and the second switch transistor (nMOS transistor) N3.

Figure 6:
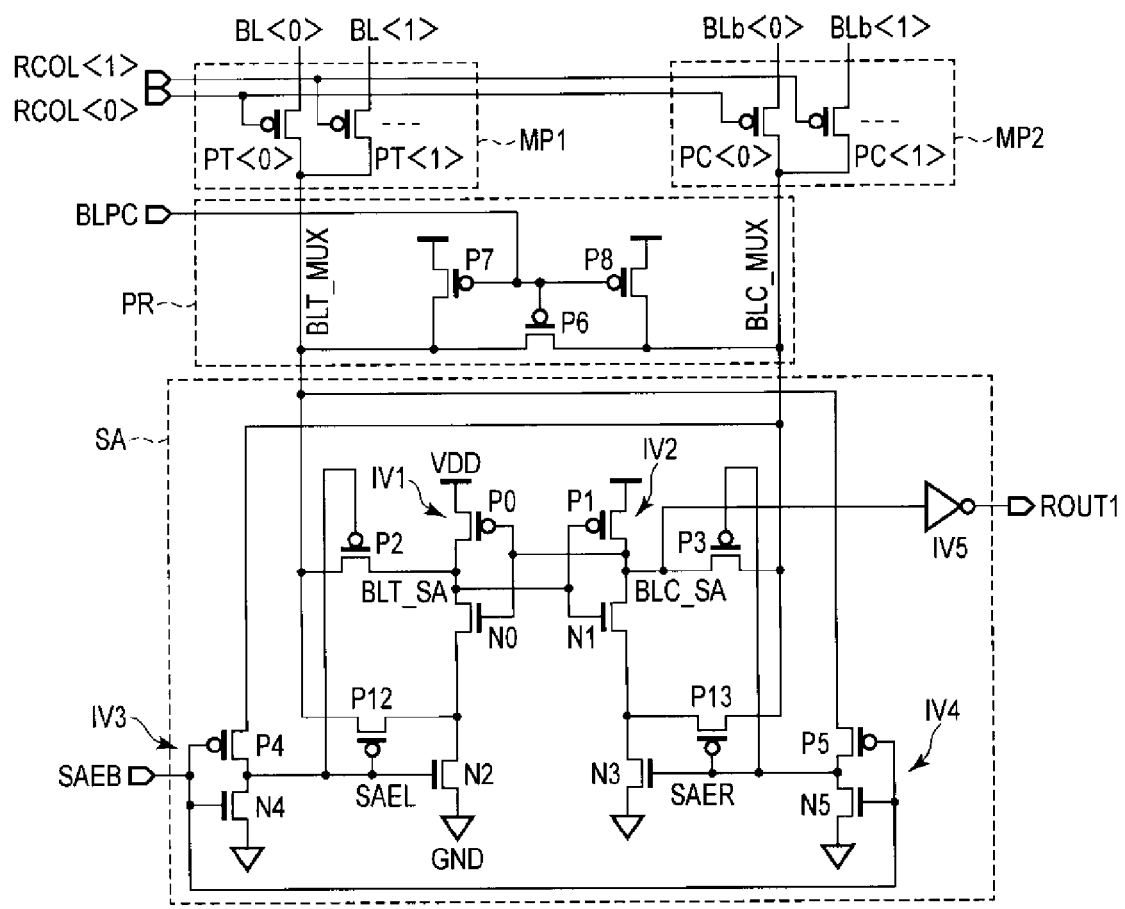
FIG. 6 is a circuit diagram of the read circuit including a sense amplifier circuit according to a fourth embodiment.

FIG. 6 is a circuit diagram depicting a configuration of a read circuit including a sense amplifier circuit according to a fourth embodiment.

As illustrated, in the sense amplifier circuit SA, a pMOS transistor P12 is connected to the node between the source of the nMOS transistor N0 and the drain of the first switch transistor N2. A pMOS transistor P13 is connected to the node between the source of the nMOS transistor N1 and the drain of the second switch transistor N3. That is, a drain of the pMOS transistor P12 is connected to the source of the nMOS transistor N0, and the bit line signals BLT_MUX are connected to a source of the pMOS transistor P12. A drain of the pMOS transistor P13 is connected to the source of the nMOS transistor N1, and the bit line signals BLC_MUX are connected to a source of the pMOS transistor P13. Furthermore, the sense amplifier signals SAEL are input to a gate of the pMOS transistor P12, and the sense amplifier signals SAER are input to a gate of the pMOS transistor P13. Other configurations and performances are the same as that of the first embodiment.

In the fourth embodiment, because the potential of the bit line signals BLT_MUX can be supplied to the source of the nMOS transistor N0 and the potential of the bit line signals BLC_MUX can be supplied to the source of the nMOS transistor N1 when the sense amplifier circuit SA is deactivated, the potentials of the sources of the nMOS transistors N0 and N1 can be prevented from being an inconstant state immediately after the activation of the sense amplifier circuit SA. Furthermore, because the drain-source voltage of the nMOS transistors N0 and N1 can be set to 0V at the moment when the sense amplifier circuit SA is activated, the influence of the mismatch in the threshold voltages of the nMOS transistors N0 and N1 can be reduced. Other effects are the same as the first embodiment.

While certain embodiments have been described, these embodiments have been presented by way of example only; and are not intended to limit the scope of the inventions. Indeed, the embodiments described herein may be embodied in a variety of other forms; furthermore, various omissions, substitutions and changes in the form of the ribbons and methods described herein may be made without departing from the spirit of the inventions. The accompanying claims and their equivalents are intended to cover such forms or modifications as would fall within the scope and spirits of the inventions.

What is claimed is:

1. A sense amplifier circuit, comprising:
 a first signal line having a first potential;
 a second signal line having a second potential;
 a first inverter that includes a first input terminal to which the second potential is supplied, a first output terminal, and a first power source terminal;
 a second inverter that includes a second input terminal to which the first potential is supplied, the second input terminal being connected to the first output terminal, a second output terminal connected to the first input terminal, and a second power source terminal;
 a first switch transistor that includes a first gate electrode to which the second potential is supplied and a first current path having a first end connected to the first power source terminal;
 a second switch transistor that includes a second gate electrode to which the first potential is supplied and a second current path having a first end connected to the second power source terminal;
 a first transfer transistor that includes a current path having first end connected to the first signal line and a second end connected to the second input terminal and the first output terminal;
 a second transfer transistor that includes a current path having a first end connected the second signal line and a second end connected to the first input terminal and the second output terminal;
 a first control circuit configured to supply one of the second potential and a reference potential to the first gate electrode and a gate electrode of the first transfer transistor according to a control signal; and a second control circuit configured to supply one of the first potential or the reference potential to the second gate electrode and a gate electrode of the second transfer transistor according to the control signal.

2. The sense amplifier circuit according to claim 1, further comprising:
an equalizer circuit connected to a node between the first power source terminal and the first switch transistor and a node between the second power source terminal and the second switch transistor.

3. The sense amplifier circuit according to claim 2, wherein the equalizer circuit includes a p-channel transistor and n-channel transistor connected in parallel.

4. The sense amplifier circuit according to claim 1, further comprising:
a pre-charge circuit connected to a first node between the first power supply terminal and the first end of the first current path of the first switch transistor and a second node between the second power supply terminal and the first end of the second current path of the second switch transistor.

5. The sense amplifier circuit according to claim 4, wherein the pre-charge circuit includes:
a first p-channel transistor including a gate electrode connected to the gate electrode of the first switch transistor, and a third current path with a first end connected to the first node and a second end connected to a power supply potential; and
a second p-channel transistor including a gate electrode connected to the gate electrode of the second switch transistor, and a fourth current path with a first end connected to the second node and a second end connected to the power supply potential.

6. The sense amplifier circuit of claim 4, wherein the pre-charge circuit includes:
a first p-channel transistor including a gate electrode connected to the gate electrode of the first switch transistor, and a third current path with a first end connected to the first node and a second end connected to the first signal line; and
a second p-channel transistor including a gate electrode connected to the gate electrode of the second switch transistor, and a fourth current path with a first end connected to the second node and a second end connected to the second signal line.

7. The sense amplifier circuit of claim 1, further comprising:
an output inverter which inverts the second potential and outputs the inverted second potential as a read out signal.

8. A sense amplifier circuit, comprising:
a first signal line;
a second signal line;
a first inverter that includes a first input terminal, a first output terminal, and a first power source terminal;
a second inverter that includes a second input terminal that is connected to the first output terminal, a second output terminal that is connected to the first input terminal, and a second power source terminal;
a first switch transistor that includes a first current path having a first end connected to the first power source terminal and a second end connected to a reference potential;
a second switch transistor that includes a second current path having a first end connected to the second power source terminal and a second end connected to the reference potential;
a first transfer transistor that includes a third current path having a first end connected to the first signal line and a second end connected to the second input terminal and the first output terminal;
a second transfer transistor that includes a fourth current path having a first end connected the second signal line and a second end connected to the first input terminal and the second output terminal;
a first control circuit configured to supply one of a potential of the second signal line and the reference potential to a gate electrode of the first switch transistor and a gate electrode of the first transfer transistor according to a control signal; and
a second control circuit configured to supply one of a potential of the first signal line and the reference potential to a gate electrode of the second switch transistor and a gate electrode of the second transfer transistor according to the control signal.

9. The sense amplifier circuit according to claim 8, further comprising:
an equalizer circuit connected to a node between the first power source terminal and the first switch transistor and a node between the second power source terminal and the second switch transistor.

10. The sense amplifier circuit according to claim 8, further comprising:
a pre-charge circuit connected to a first node between the first power supply terminal and the first end of the first current path of the first switch transistor and a second node between the second power supply terminal and the first end of the second current path of the second switch transistor.

11. The sense amplifier circuit according to claim 10, wherein the pre-charge circuit includes:
a first p-channel transistor including a gate electrode connected to the gate electrode of the first switch transistor, and a fifth current path with a first end connected to the first node and a second end connected to a power supply potential; and
a second p-channel transistor including a gate electrode connected to the gate electrode of the second switch transistor, and a sixth current path with a first end connected to the second node and a second end connected to the power supply potential.

12. The sense amplifier circuit of claim 10, wherein the pre-charge circuit includes:
a first p-channel transistor including a gate electrode connected to the gate electrode of the first switch transistor, and a fifth current path with a first end connected to the first node and a second end connected to the first signal line; and
a second p-channel transistor including a gate electrode connected to the gate electrode of the second switch transistor, and a fourth current path with a first end connected to the second node and a second end connected to the second signal line.

13. The sense amplifier circuit of claim 8, wherein the first inverter and second inverter each comprise a p-channel transistor and an n-channel transistor connected in series.

14. The sense amplifier circuit of claim 8, the first switch transistor and the second switch transistor are each an n-channel transistor.

15. A memory device, comprising:
a memory cell array;
a first signal line connected to a plurality of bit lines of the memory cell array by a first multiplexer;

a second signal line connected to a plurality of complementary bit lines of the memory cell array by a second multiplexer;
a first inverter that includes a first input terminal, a first output terminal, and a first power source terminal;
a second inverter that includes a second input terminal that is connected to the first output terminal, a second output terminal that is connected to the first input terminal, and a second power source terminal;
a first switch transistor that includes a first current path having a first end connected to the first power source terminal and a second end connected to a reference potential;
a second switch transistor that includes a second current path having a first end connected to the second power source terminal and a second end connected to the reference potential;
a first transfer transistor that includes a third current path having a first end connected to the first signal line and a second end connected to the second input terminal and the first output terminal;
a second transfer transistor that includes a fourth current path having a first end connected the second signal line and a second end connected to the first input terminal and the second output terminal;
a first control circuit configured to supply one of a potential of the second signal line and the reference potential to a gate electrode of the first switch transistor and a gate electrode of the first transfer transistor according to a control signal; and
a second control circuit configured to supply one of a potential of the first signal line and the reference potential to a gate electrode of the second switch transistor and a gate electrode of the second transfer transistor according to the control signal.

16. The memory device according to claim 15, further comprising:
an equalizer circuit connected to a node between the first power source terminal and the first switch transistor and a node between the second power source terminal and the second switch transistor.

17. The memory device according to claim 15, further comprising:
a pre-charge circuit connected to a first node between the first power supply terminal and the first end of the first current path of the first switch transistor and a second node between the second power supply terminal and the first end of the second current path of the second switch transistor, the pre-charge circuit including:
a first p-channel transistor including a gate electrode connected to the gate electrode of the first switch transistor, and a fifth current path with a first end connected to the first node and a second end connected to a power supply potential; and
a second p-channel transistor including a gate electrode connected to the gate electrode of the second switch transistor, and a sixth current with a first end connected to the second node and a second end connected to the power supply potential.

18. The memory device according to claim 15, further comprising:
a pre-charge circuit connected to a first node between the first power supply terminal and the first end of the first current path of the first switch transistor and a second node between the second power supply terminal and the first end of the second current path of the second switch transistor, the pre-charge circuit including:
a first p-channel transistor including a gate electrode connected to the gate electrode of the first switch transistor, and a fifth current path with a first end connected to the first node and a second end connected to the first signal line; and
a second p-channel transistor including a gate electrode connected to the gate electrode of the second switch transistor, and a fourth current path with a first end connected to the second node and a second end connected to the second signal line.

* * * * *